(12) United States Patent
McPartland et al.

(10) Patent No.: US 6,552,931 B2
(45) Date of Patent: *Apr. 22, 2003

(54) LOW VOLTAGE FLASH EEPROM MEMORY CELL WITH IMPROVED DATA RETENTION

(75) Inventors: Richard J. McPartland, Nazareth, PA (US); Ranbir Singh, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/957,124

(22) Filed: Sep. 20, 2001

(65) Prior Publication Data

US 2002/0015327 A1 Feb. 7, 2002

Related U.S. Application Data

(63) Continuation of application No. 09/567,521, filed on May 9, 2000, now Pat. No. 6,324,095.

(51) Int. Cl.[7] .............................................. G11C 16/04
(52) U.S. Cl. ........................... 365/185.05; 365/185.14; 257/315; 438/257
(58) Field of Search ........................ 365/185.05, 185.14, 365/185.01; 257/315; 438/257

(56) References Cited

U.S. PATENT DOCUMENTS

| | | | |
|---|---|---|---|
| 5,686,332 A | | 11/1997 | Hong |
| 5,780,341 A | * | 7/1998 | Ogura .................. 438/259 |
| 6,077,716 A | * | 6/2000 | Yoo ........................ 438/240 |
| 6,151,254 A | | 11/2000 | Kanamori |
| 6,157,058 A | | 12/2000 | Ogura |

* cited by examiner

Primary Examiner—Hoai Ho

(57) ABSTRACT

The present invention provides memory circuit including a control input, a switch, and a voltage transfer structure including a linear capacitor that electrically couples the control input to the switch.

16 Claims, 7 Drawing Sheets

LOW VOLTAGE FLASH EEPROM MEMORY CELL WITH IMPROVED DATA RETENTION

This is a continuation of U.S. patent application Ser. No. 09/567,521, filed on May 9, 2000 now U.S. Pat. No. 6,324,095, entitled "LOW VOLTAGE FLASH EEPROM MEMORY CELL WITH IMPROVED DATA RETENTION," to Richard McPartland, et al., which is incorporated herein by reference.

TECHNICAL FIELD OF THE INVENTION

The present invention is directed, in general, to a voltage transfer device for use in a memory cell and, more specifically, to a low voltage floating gate non-volatile memory cell with improved data retention.

BACKGROUND OF THE INVENTION

With the reality of systems on a chip (SoC), large amounts of memory, such as dynamic random access memory (DRAM) and static random access memory (SRAM), are required and presently embedded within Application-Specific Integrated Circuits (ASIC), logic, and processor chips. To keep yields reasonable, memory redundancy is highly desirable. One conventional approach used to achieve memory redundancy involved laser-link redundancy processes. However, a disadvantage of laser-link redundancy is that it requires large capital investment and is not well suited for low to medium volume ASIC due-to per code engineering efforts and setup costs. A more cost-effective method for controlling redundancy uses non-volatile switches, which employ single-poly programmable read only memory (PROM) cells to achieve low fabrication costs by only using one masking step in addition to those in the core complementary metal oxide semiconductor (CMOS) technology. Other applications for single-poly flash non-volatile memory cells are storage of secure or other identification codes and function switches, and storage of small amounts of data or code.

To minimize leakage of charge from the floating gate, the gate oxide in some PROM memory cells are typically thicker than in the core CMOS technology with which the memory is often associated. For example, the gate oxide thickness in memory cells may be as much as 10 nm thick, while the gate oxide thickness in the core CMOS technology may be about 5 nm thick. Due to the difference in the gate oxide thickness, the core CMOS devices typically have a threshold voltage ($V_T$) of about 0.6 volts, while the memory cell devices have a $V_T$ of about 1.2 volts. The difference in these threshold voltages poses problems for the proper operation of the memory cell.

When reading a conventional non-volatile floating gate erased cell, the word-line voltage is typically first dropped across the gate oxide MOS capacitor (MC1) until the voltage across MC1 reaches a typical threshold voltage of about 1.2 volts. The remainder of the word-line voltage swing raises the potential of the memory cells floating gate. With a word-line swing of 1.5 volts, the floating gate is only moved 0.3 volts, which is insufficient for proper operation of the memory cell. To make a typical erased cell conductive when raising the row, the floating gate must reach at least 1.35 volts, which is the threshold voltage plus about 0.15 volts of drive voltage. To do this, 1.05 volts of charge must have been placed on the floating gate by prior erasure. Due to the relatively large electric field across the oxide corresponding to this large amount of floating gate charge, the charge is likely to leak off the floating gate, destroying data retention. Furthermore, the signal margin associated with the small floating gate voltage swing (0.3 volts) is too small for reliable operation. If the cell loses as much as 150 mV of floating gate charge, or if there is 150 mV of power supply or word-line noise, the cell can read in error.

One memory cell provides a low-cost single-poly EEPROM cell. However, this cell is not compatible with the relatively low source/drain to tub breakdown voltages, nor the low power supply voltages common in today's low voltage CMOS technologies. More specifically, this particular device was configured to operate in older technologies having higher voltages of about 5 volts. Due to the higher voltages, there was enough voltage, after the threshold voltage drop across MC1, to operate the memory cell's switch. In addition, the core CMOS device gate oxides in these older technologies were thicker, so the threshold increase between the core CMOS technology and the EEPROM memory devices was smaller or nonexistant. Moreover, the lower junction breakdown voltage associated with these conventional devices in the newer technologies, prevents erasing with Fowler-Northam (FN) tunneling and limits the lowering of cell threshold when erasing with hot hole injection from band-to-band tunneling.

Accordingly, what is needed in the art is a low cost memory cell that does not experience data retention problems associated with prior art devices and that operates with low power supply voltages, high device thresholds, and low source/drain to tub breakdown voltage.

SUMMARY OF THE INVENTION

To address the above-discussed deficiencies of the prior art, the present invention provides a control input, a switch, and a voltage transfer structure including a linear capacitor that electrically couples the control input to the switch.

BRIEF DESCRIPTION OF THE DRAWINGS

The invention is best understood from the following detailed description when read with the accompanying FIGUREs. It is emphasized that in accordance with the standard practice in the semiconductor industry the various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
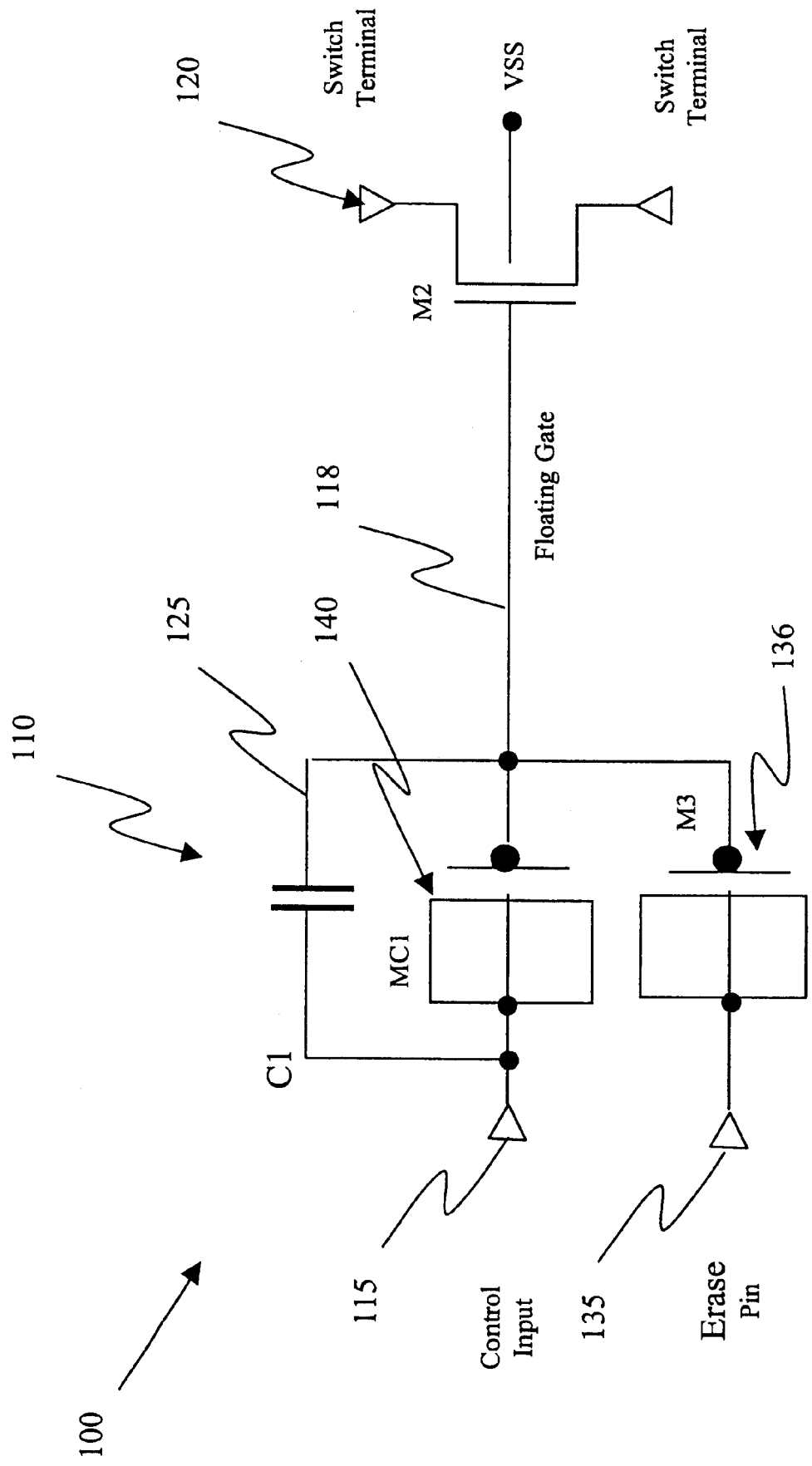
FIG. 1 illustrates a schematic diagram of a memory cell according to the present invention.

An exemplary embodiment of the present invention is illustrated in FIG. 1, which is a schematic diagram of a memory cell 100 according to the present invention. The memory cell 100 includes a voltage transfer structure 110. In the illustrated embodiment, the memory cell 100 includes a control input 115, such as a word-line, a floating gate 118, and a switch 120, also designated as M2 in the schematic diagram. The voltage transfer structure 110 includes a linear capacitor 125, which is also designated as C1 and a part of which functions as a floating gate. As used herein, a linear capacitor is a capacitor whose output varies in substantially direct proportion to its input. In other words, a substantial portion of the voltage from the control input 115 is transferred directly from the control input 115 to the switch 120 via the linear capacitor 125 such that a substantially linear relationship exists between the control input voltage and the floating gate voltage. This relationship is illustrated in FIG. 2, and is discussed more fully herein.

Illustratively, the memory cell 100 may include a conventional erase input 135 or erase pin and associated erase MOS capacitor device, M3 136, which are used to erase the memory cell by lowering the cell threshold. Because the erase input 135 is the connection of the device M3's source/drain and tub, it can be raised above the source/drain to tub forward breakdown voltage to just below the much higher tub to substrate forward breakdown voltage. With the control gate biased at ground, the resulting erase input's 135 gate oxide field is sufficient for Fowler-Nordheim (FN) tunneling of electrons from the floating gate 118 to the erase input's 135 gate. It should be noted that the erase input 135 and device M3 are optional, and thus, may not be present in all embodiments. When erase input and device are not included, the cell can be erased by other methods known to those skilled in the art such as but not limited to, hot hole injection from the source/drain of MC1 to the floating gate, and ultraviolet erase. Also illustrated is a non-linear capacitor 140, also designated MC1 (i.e., MOS capacitor), which may make up a part of the voltage transfer structure 110. In an illustrative embodiment, the non-linear capacitor 140 is wired in parallel with the linear capacitor 125 and in series with the control input 115 and the switch 120, as shown in FIG. 1. The non-linear capacitor 140, however, is also an optional component, which is particularly useful in those embodiments of the present invention where there is no erase input 135.

Figure 2:
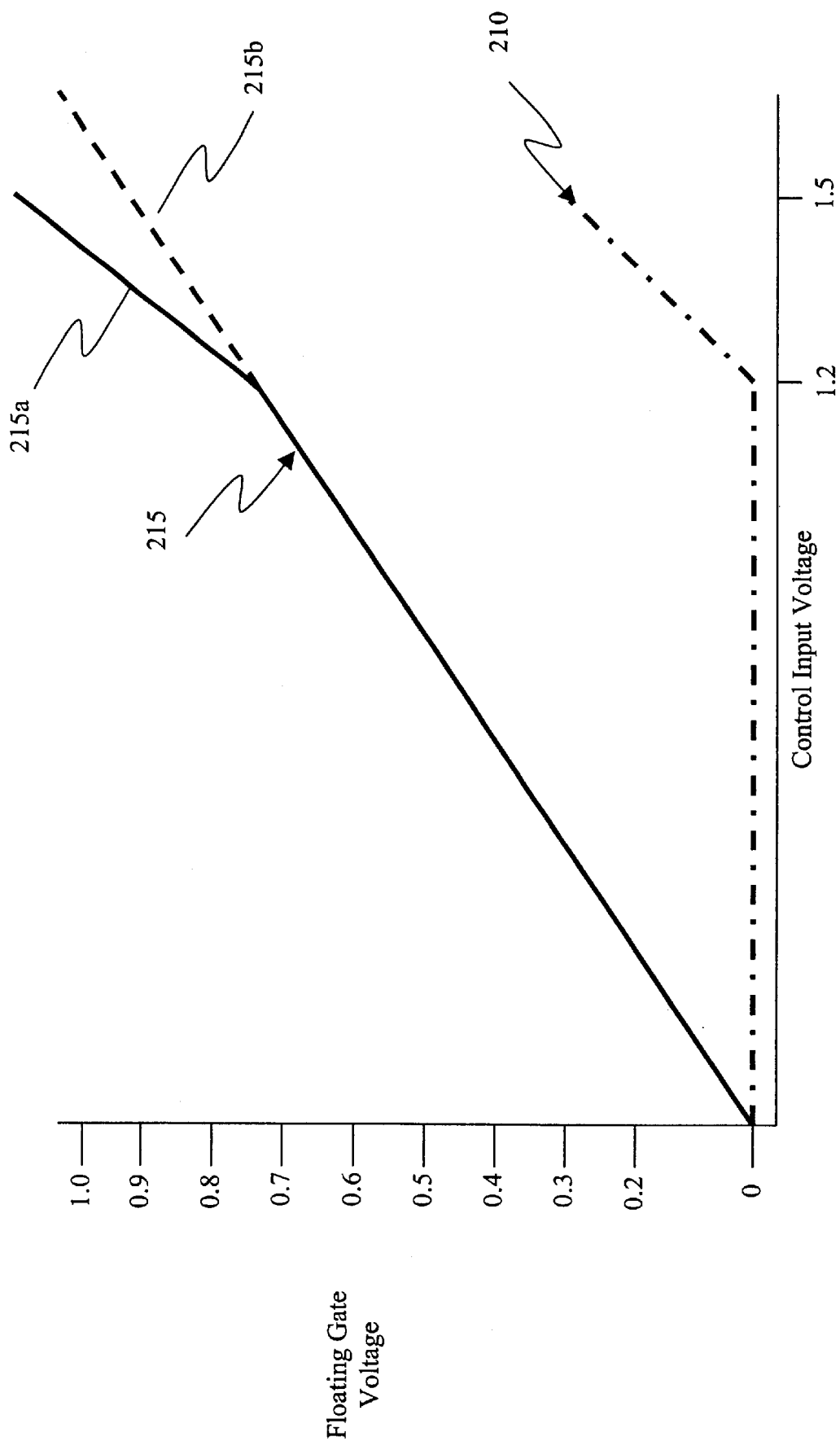
FIG. 2 illustrates a graph of relationships between the control input voltage and the floating gate voltage of a conventional memory cell and a memory cell according to the present invention.

In FIG. 2 with continued reference to FIG. 1, dashed line 210 represents a graph of the control input voltage versus the floating gate voltage as found in the above-discussed prior art memory cell devices, and line 215 represents a graph of the control input voltage versus the floating gate voltage as found in an illustrative memory cell 100 according to the present invention. As illustrated by dashed line 210, the relationship between the control input voltage and the floating gate voltage in the conventional memory cell is substantially non-linear; that is, even though the input voltage increases, there is no corresponding increase in the voltage on the floating gate 118 until a threshold voltage of 1.2 volts, which is the threshold associated with the MOS capacitor, is reached, as previously discussed. Once the MOS capacitor's threshold voltage is reached, the voltage on the floating gate 118 begins to increase, but does so only up to about 0.3 volts, which is insufficient for proper memory cell operation.

In clear contrast, line 215 represents the substantially linear relationship between the control input voltage and the floating gate voltage in the memory cell 100 provided by the present invention. As the control input voltage increases, there is a corresponding increase in the voltage on the floating gate without significant loss of voltage in overcoming a threshold voltage of the device. The end of line 215 is divided into two different segments 215a, 215b to illustrate the affect that the non-linear capacitor 140 has on the floating gate voltage when present. When the threshold voltage of 1.2 volts of the non-linear capacitor 140 is reached, it begins transferring voltage to the floating gate above that of the linear capacitor 125 and is added to the voltage transfer of the linear capacitor 125, as indicated. However, if the non-linear capacitor 140 is not present, the voltage from the linear capacitor 140 would be represented by line 215b. In either case, however, sufficient voltage is transferred from the control input 115 to the switch 120 to effectively operate the memory cell 100.

Therefore, the present invention reduces the effective threshold of the memory cell, making more of the control input voltage, e.g., word-line, swing available to the floating gate 118, and the amount of charge on the floating gate 118 needed to erase the memory cell 100 is reduced. This improves data retention of an erased cell, and the increased floating gate voltage swing increases signal margin for reliable operation. Additionally, the increased word-line to floating gate coupling reduces the high word-line voltage necessary to program the cells.

Figure 3:
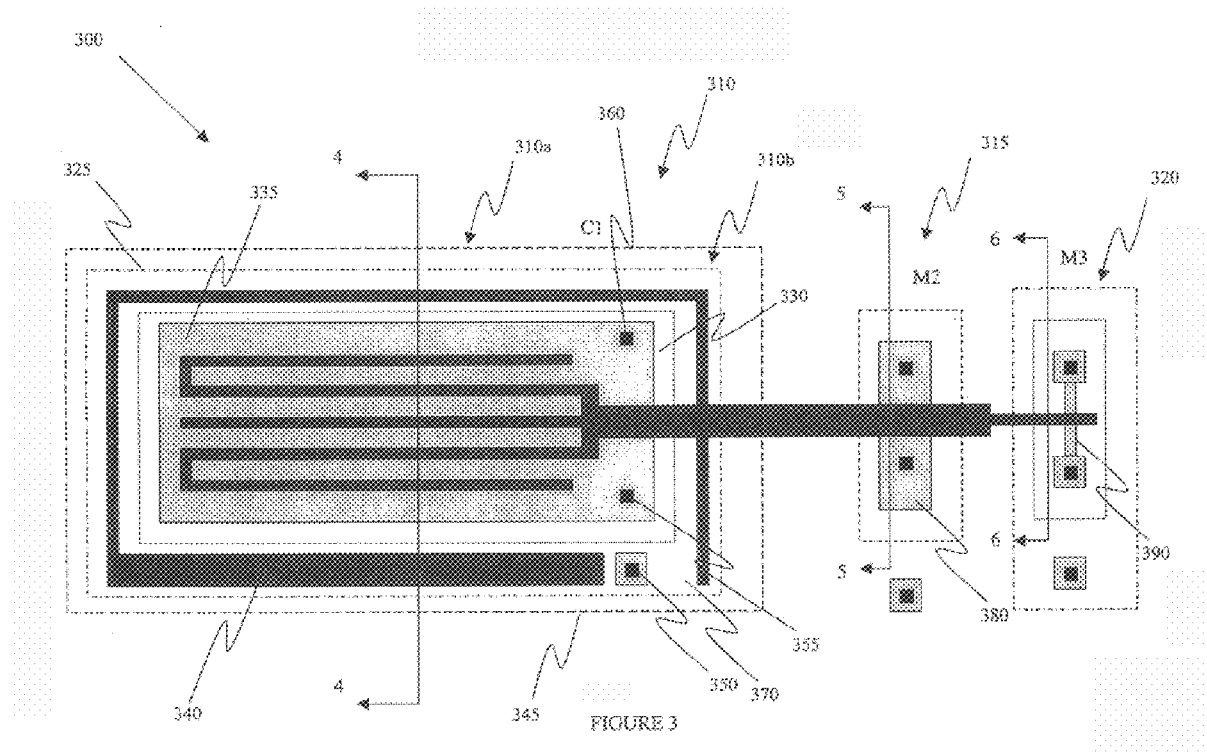
FIG. 3 illustrates an overhead view of an illustrative embodiment of a memory cell according to the present invention.

Turning now to FIG. 3 with continued reference to FIG. 1, there is shown an overhead view of an illustrative embodiment of a memory cell 300 according to the present invention. In this particular view there is shown a voltage transfer device 310, a switch device 315, and an erase device 320. A polysilicon gate structure 340 serves as the floating gate of the memory cell 300 and extends from the voltage transfer device 310 to the switch device 315 and the erase device 320 to form the floating gates for all three devices. In an exemplary embodiment, the voltage transfer device 310 includes a linear capacitor 310a and a non-linear capacitor 310b. The voltage transfer device 310 includes a well or tub region 325 in which a gate oxide region 335 is formed. The polysilicon gate structure 340 is formed over part of the gate oxide region 335 of the voltage transfer device 310. It is also formed over gate oxide regions 380 and 390 of the switch device 315 and the erase device 320, respectively. The polysilicon gate structure 340 also is formed over part of a field oxide region 370, which is a region outside of the gate oxide regions 335, 380 and 390. A source/drain region 330 is implanted within the gate oxide region 335 but masked by the polysilicon gate structure 340 so that the source/drain region 330 is that region within the gate oxide region 335 not covered by the polysilicon gate structure 340. Heat treatments out-diffuse the source/drain implanted doping to extend a small distance under the polysilicon edge along the perimeter of the polysilicon gate structure 340 within the gate oxide region 335. It is the linear parallel plate and fringing capacitor formed by the overlap of the polysilicon gate structure 340 over the out-diffused source/drain region 330 that makes the first component of the linear capacitor 310a (also 125 or C1 in FIG. 1).

The polysilicon gate structure 340 within the gate oxide region 335 of the voltage transfer device 310, in an advantageous embodiment, has a long/narrow, serpentine, meandering or comb-like configuration that substantially increases the amount of polysilicon edge under which the source/drain out-diffusion can form the first component of the linear capacitor 310a. Moreover, the large polysilicon perimeter of this polysilicon configuration yields a relatively large value of the first component of the linear capacitor 310a. It is desired to have the total linear capacitance, due to the linear capacitor 310a, from the control input 115 to the floating gate 118 of the voltage transfer structure 310 to be substantially larger, at least five times larger, than the sum of all other capacitance's to the floating gate structure 118, but excluding the nonlinear capacitance due to the non-linear capacitor 310b. This additional capacitance to the floating gate consists mostly of polysilicon to source/drain capacitance of the switch device 315, polysilicon to source/drain capacitance of the erase device 320, and polysilicon over the field oxide region 370 to substrate parasitic capacitance.

In practice, to ensure proper cell operation, the perimeter of the polysilicon gate of the voltage transfer device 310 should be at least five times greater than the sum of the perimeter of the polysilicon gate over the gate oxide region 380 of switch device 315, and the perimeter of the polysilicon gate over gate oxide region 390 of erase device 320. Furthermore, the area of the polysilicon gate structure 340 over the gate oxide region 335 of the voltage transfer device 310 should be at least five times the area of the sum of the polysilicon gate structure 340 area over the gate oxide region 380 of switch device 315, and of polysilicon gate structure 340 area over the gate oxide region 390 of the erase device 320.

The second component of the linear capacitor 310a is the parallel plate capacitor having the polysilicon over field oxide as one plate or terminal, and the voltage transfer device's tub region 325 under the polysilicon and field oxide as the other plate or terminal. The tub terminal is connected to the control input 115 and the polysilicon is connected to the floating gate 118.

The third component of the linear capacitor 310a is the parallel plate capacitor having a metal plate 345 as one terminal and the polysilicon under the metal plate 345 as the other terminal. The metal plate 345 is connected to the control input 115, and is connected to the well region 325 by a well tie 350, and is connected to the source/drain region 330 by vias 355 and 360. The polysilicon terminal is connected to, or is part of the floating gate 118.

The nonlinear capacitor 310b is the nonlinear capacitance associated with the Metal Oxide Semiconductor (MOS) capacitance formed in the voltage transfer device 310 with the polysilicon over gate oxide within the well region 325 being one terminal and the well region underneath the polysilicon being the other terminal. The well region 325 as well as its associated source/drain region 330 is connected to the control input 115, and forms part of the floating gate 118.

Figure 4:
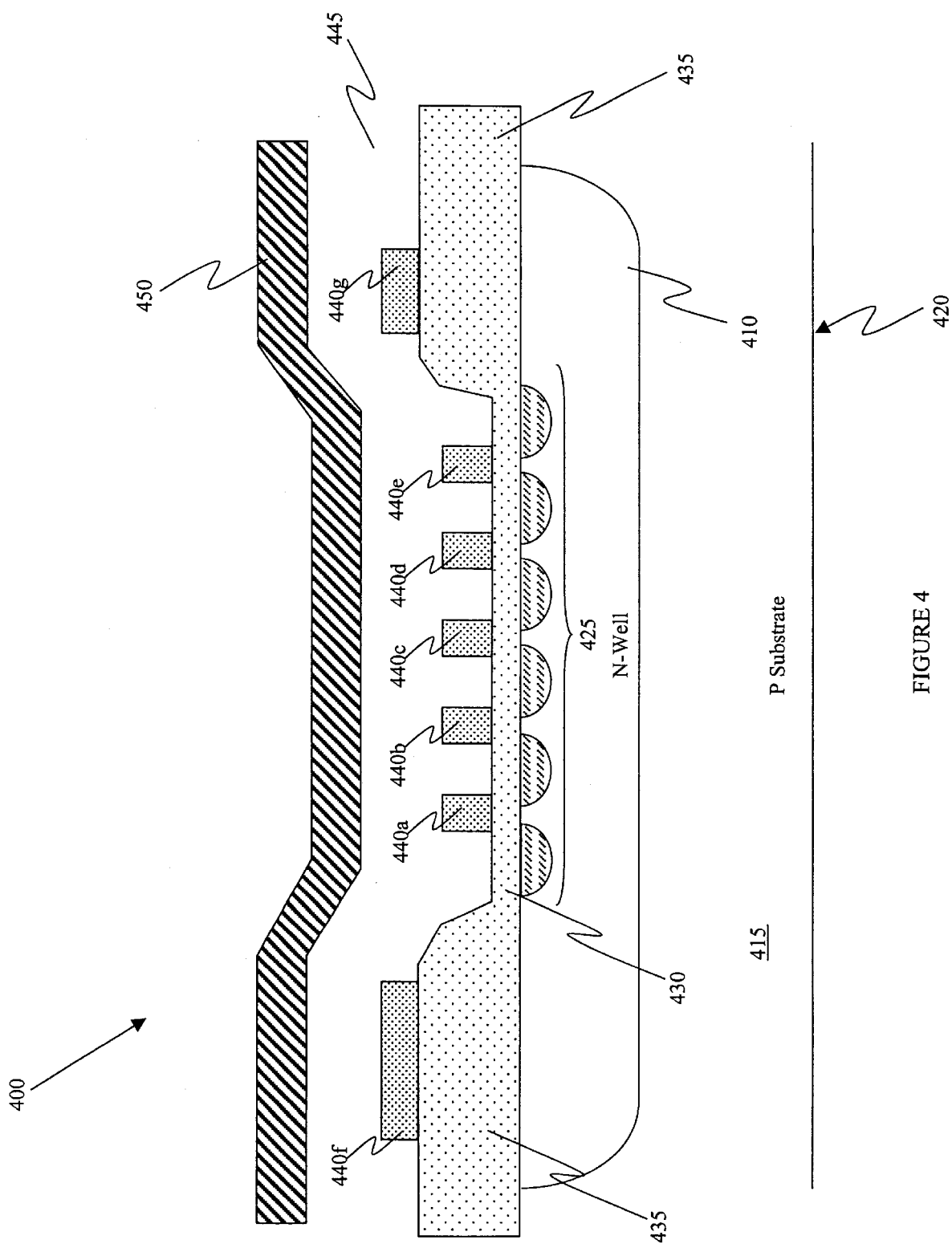
FIG. 4 illustrates a sectional view taken through the line 4—4 of FIG. 3, which includes a voltage transfer structure according to the present invention.

Turning now to FIG. 4, there is illustrated a sectional view taken through the line 4—4 of FIG. 3, which includes a voltage transfer structure 400. As seen from this view, the voltage transfer structure 400 includes an N-well 410 located over a substrate 415, such as a P-type substrate, of a semiconductor wafer 420. The voltage transfer structure 400 further includes multiple source/drains 425 formed in the N-well 410, a gate oxide 430, field oxide regions 435, a gate structure 440 including serpentine gate structures 440a–440e located over the gate oxide 430, gate structures 440f, 440g located over the field oxide regions 435, a dielectric layer 445 and a conductive layer 450. The source/drain regions 425 result from conventionally doping the N-well 410 in the presence of the serpentine gate structures 440a–440e.

This structure uniquely forms both the previously-discussed non-linear and linear capacitors. The linear capacitor is provided by the capacitance associated with the gate structures 440a–440e overlapping the source/drain regions 425 and the capacitance associated with the gate structures 440f–440g that overlay the field oxide regions 435, and the overlying dielectric layer 445 and the conductive layer 450. The non-linear capacitance is provided by the MOS capacitance of the polysilicon gate structure 440a–440e over the N-well 410.

Figure 5:
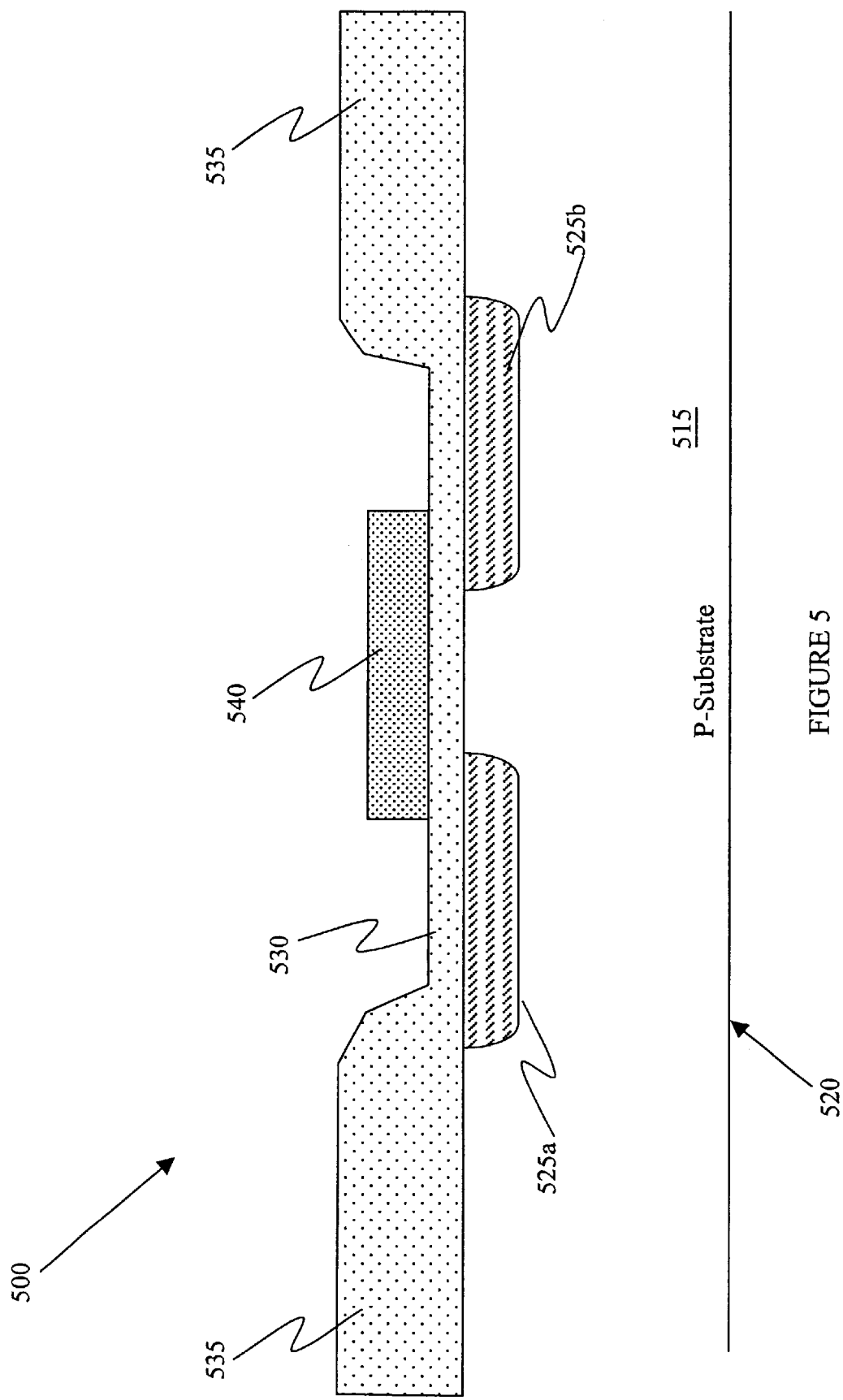
FIG. 5 illustrates a sectional view as taken through the switch, line 5—5, of FIG. 3.

FIG. 5 illustrates a sectional view as taken through the switch, line 5—5, of FIG. 3. As seen from this view, a conventional MOS switch 500 includes a source 525a and drain 525b, a gate oxide 530, field oxide regions 535, and a gate structure 540 located over the gate oxide 530, all of which are formed by conventional processes.

Figure 6:
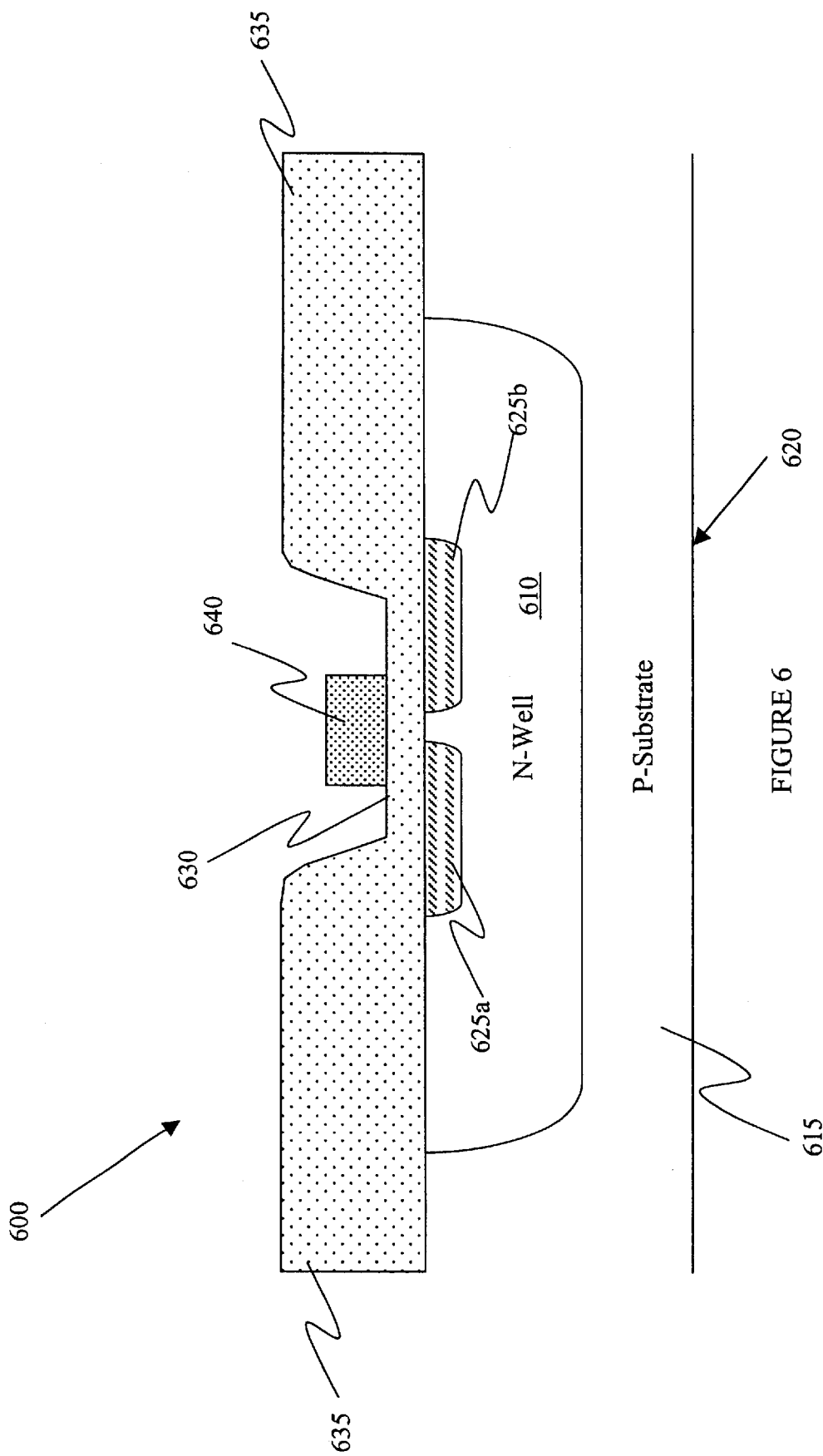
FIG. 6 illustrates a sectional view as taken through the erase pin, line 6—6, of FIG. 3.

FIG. 6 illustrates a sectional view as taken through the erase device, line 6—6, of FIG. 3. As seen from this view, the erase device 600 includes an N-well 610 located over a substrate 615, such as a P-type substrate, of a semiconductor wafer 620. The erase device 600 further includes a source 625a and a drain 625b formed in the N-well 610, a gate oxide 630, field oxide regions 635, and a gate structure 640 located over the gate oxide 630, all of which are formed by conventional processes. As previously discussed, the erase device 600 helps to lower the memory cell's threshold.

It should be noted that while certain dopant schemes have been discussed with respect to FIGS. 4–6, the present invention is not limited to those dopant schemes, and it should be understood that different dopant schemes other than those described may also be used and are within the scope of the present invention as well.

Figure 7:
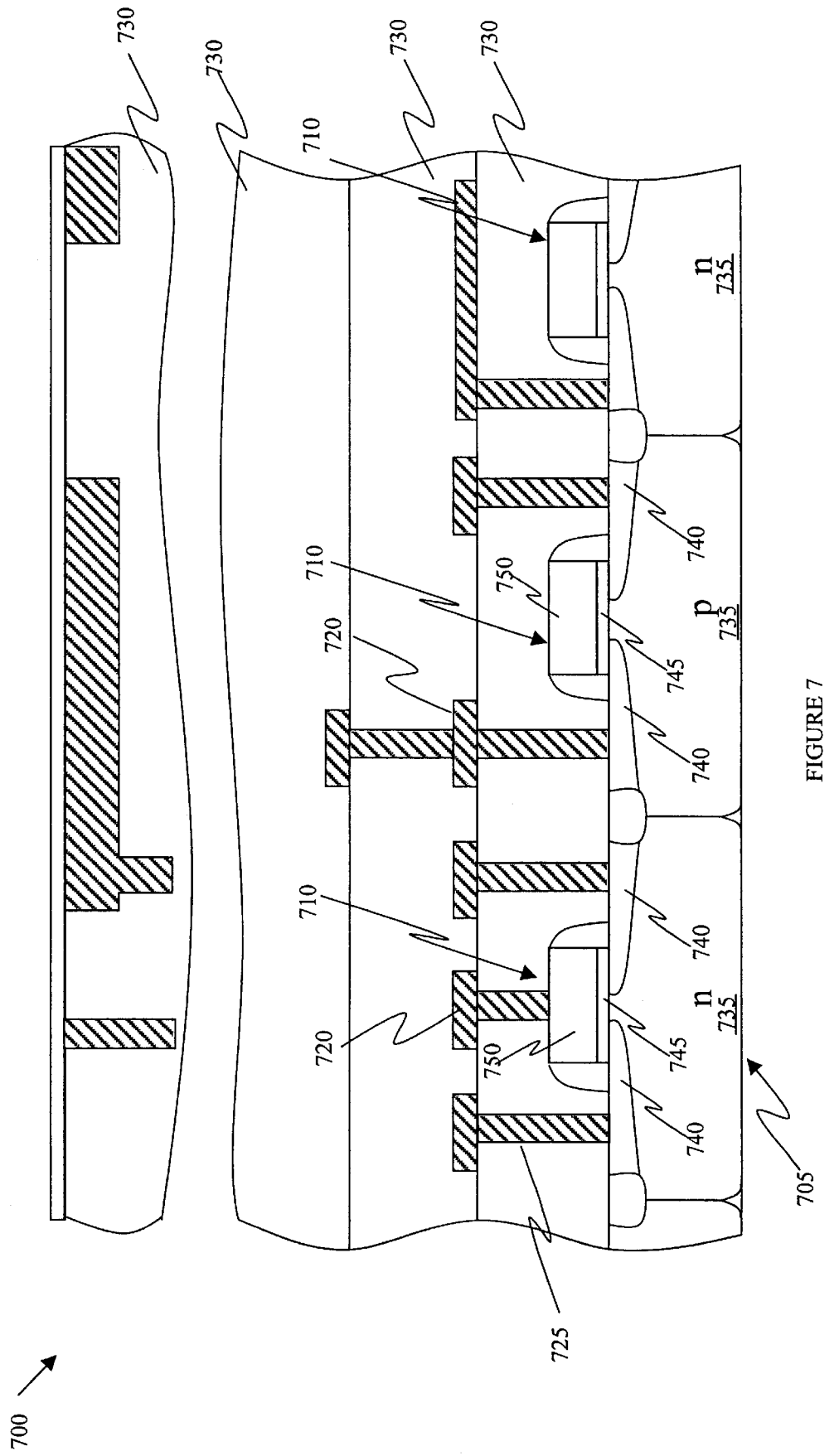
FIG. 7 illustrates a sectional view of a conventionally formed integrated circuit (IC) that may be used in conjunction with the present invention.

Turning now to FIG. 7, there is illustrated a sectional view of a conventionally formed integrated circuit (IC) 700 that may be used in conjunction with the present invention. While FIG. 7 does not specifically illustrate how the memory circuit described in FIGS. 1–6 is electrically connected to the IC 700, one who is skilled in the art understands how to make such a connection and integrate the memory circuit, as provided herein, into the IC 700. The IC 700 includes conventional transistors 710 that are connected to interconnects 720 by contacts or vias 725. Dielectric layers 730 isolate the various layers of the IC 700. As illustrated, the transistors 710 are located on a semiconductor wafer substrate (generally designated 705), and the interconnects 720, which are located within the dielectric layers 730, connect the transistors 710 to different layers within the IC circuit 700. Being of conventional design, the transistors 710 include tubs 735, source/drains 740, gate oxides 745 and gates 750. One who is skilled in the art knows how to fabricate the transistors 710, interconnects 720, contacts or vias 725 and dielectric layers 730. Furthermore, it is also understood that multiple transistors 710, interconnects 720 and dielectric layers 730, are typically interconnected to form the IC 700.

Although the present invention has been described in detail, those skilled in the art should understand that they can make various changes, substitutions and alterations herein without departing from the spirit and scope of the invention in its broadest form.

What is claimed is:

1. A memory cell, comprising:
   a control input;
   a switch; and
   a voltage transfer structure including a linear capacitor that electrically couples the control input to the switch, wherein the linear capacitor has a capacitance substantially greater than a capacitance of the switch.

2. The memory cell as recited in claim 1 further comprising an erase input that is electrically connected to the switch.

3. The memory cell as recited in claim 1 wherein the voltage transfer structure further comprises a non-linear capacitor connected in series with the control input and the switch and in parallel with the linear capacitor.

4. The memory cell as recited in claim 3 wherein the non-linear capacitor forms a portion of the linear capacitor.

5. The memory cell as recited in claim 1 wherein the linear capacitor has a capacitance at least five times as great as the sum of a floating gate to source/drain area capacitance within the switch and floating gate to substrate capacitances.

6. The memory cell as recited in claim 5 wherein the linear capacitor has a first electrode and the linear capacitor includes source and drain regions, a gate dielectric located over the source and drain regions, and a serpentine second electrode located on the gate dielectric that overlaps the source and drain regions and the first electrode.

7. The memory cell as recited in claim 6 wherein the second electrode forms a floating gate for the memory cell.

8. The memory cell as recited in claim 1 further including a gate oxide having a thickness of about 10 nm.

9. An integrated circuit having a programable read-only-memory (PROM), comprising:

transistors;

memory cells with at least one of the memory cells including:

a voltage transfer structure including a linear capacitor that electrically couples a control input to a switch, wherein the linear capacitor has a capacitance substantially greater than a capacitance of the switch; and interconnects that connect the transistors and the memory cells to form an operative integrated circuit.

10. The integrated circuit as recited in claim 9 further comprising an erase input that is connected to the switch.

11. The integrated circuit as recited in claim 9 wherein the voltage transfer structure further comprises a non-linear capacitor connected in series with the control input and the switch and in parallel with the linear capacitor.

12. The integrated circuit as recited in claim 11 wherein the non-linear capacitor forms a portion of the linear capacitor.

13. The integrated circuit as recited in claim 9 wherein the linear capacitor has a capacitance at least five times as great as the sum of a floating gate to source/drain area capacitance within the switch and floating gate to substrate capacitances.

14. The integrated circuit as recited in claim 13 wherein the linear capacitor has a first electrode and the linear capacitor includes source and drain regions, a gate dielectric located over the source and drain regions, and a serpentine second electrode located on the gate dielectric that overlaps the source and drain regions and the first electrode.

15. The integrated circuit cell as recited in claim 14 wherein the second electrode forms a floating gate for the memory cell.

16. The integrated circuit as recited in claim 9 further including a gate oxide having a thickness of about 10 NM.

* * * * *